(12) United States Patent
Ahn et al.

(10) Patent No.: US 9,048,026 B2
(45) Date of Patent: Jun. 2, 2015

(54) MULTILAYERED CERAMIC CAPACITOR, MOUNTING STRUCTURE OF CIRCUIT BOARD HAVING MULTILAYERED CERAMIC CAPACITOR MOUNTED THEREON, AND PACKING UNIT FOR MULTILAYERED CERAMIC CAPACITOR

(71) Applicant: SAMSUNG ELECTRO-MECHANICS CO., LTD., Suwon, Gyunggi-do (KR)

(72) Inventors: Young Ghyu Ahn, Gyunggi-do (KR); Min Cheol Park, Gyunggi-do (KR); Tae Hyeok Kim, Gyunggi-do (KR); Sang Soo Park, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 299 days.

(21) Appl. No.: 13/764,184

(22) Filed: Feb. 11, 2013

(65) Prior Publication Data
US 2014/0131082 A1 May 15, 2014

(30) Foreign Application Priority Data
Nov. 9, 2012 (KR) .......................... 10-2012-0126450

(51) Int. Cl.
*H01G 4/30* (2006.01)
*H01G 4/06* (2006.01)
(Continued)

(52) U.S. Cl.
CPC ............... *H01G 4/12* (2013.01); *H05K 3/3442* (2013.01); *H05K 2201/10015* (2013.01); *H05K 2201/2045* (2013.01); *H01G 4/30* (2013.01); *H01G 2/065* (2013.01); *H01G 4/012* (2013.01)

(58) Field of Classification Search
CPC ....................................................... H01G 4/30
USPC ......................................... 361/301.4, 311, 303
See application file for complete search history.

(56) References Cited

U.S. PATENT DOCUMENTS

| 6,045,893 A | 4/2000 | Fukushima et al. |
| 7,336,475 B2 * | 2/2008 | Bultitude et al. ............. 361/303 |

(Continued)

FOREIGN PATENT DOCUMENTS

| JP | 05-047591 A1 | 2/1993 |
| JP | 6-215978 A | 8/1994 |

(Continued)

OTHER PUBLICATIONS

Japanese Office Action issued in Application No. 2013-021130 dated Nov. 26, 2013.

(Continued)

*Primary Examiner* — Eric Thomas
(74) *Attorney, Agent, or Firm* — McDermott Will & Emery LLP

(57) ABSTRACT

There is provided a multilayered ceramic capacitor, including: a ceramic body; an active layer including a plurality of first and second internal electrodes; an upper cover layer; a lower cover layer, the lower cover layer being thicker than the upper cover layer; a dummy electrode formed inside at least one of the upper and lower cover layers; and first and second external electrodes, wherein, when A is defined as ½ of an overall thickness of the ceramic body, B is defined as a thickness of the lower cover layer, C is defined as ½ of an overall thickness of the active layer, and D is defined as a thickness of the upper cover layer, a ratio of deviation between a center of the active layer and a center of the ceramic body, (B+C)/A, satisfies $1.063 \leq (B+C)/A \leq 1.745$.

23 Claims, 10 Drawing Sheets

(51) Int. Cl.
*H01G 4/12* (2006.01)
*H05K 3/34* (2006.01)
*H01G 2/06* (2006.01)
*H01G 4/012* (2006.01)

(56) References Cited

U.S. PATENT DOCUMENTS

| | | | |
|---|---|---|---|
| 2003/0183553 A1* | 10/2003 | Fujimura et al. | 206/725 |
| 2006/0158827 A1 | 7/2006 | Lee et al. | |
| 2011/0141660 A1 | 6/2011 | Jeong et al. | |
| 2012/0152604 A1 | 6/2012 | Ahn et al. | |

FOREIGN PATENT DOCUMENTS

| | | |
|---|---|---|
| JP | 07-045469 A | 2/1995 |
| JP | 07-329915 A | 12/1995 |
| JP | 11-171645 A | 6/1999 |
| JP | 2006-203165 A | 8/2006 |
| JP | 2012-134498 A | 7/2012 |
| KR | 10-2005-0071733 A | 7/2005 |
| KR | 10-2011-0065625 A | 6/2011 |

OTHER PUBLICATIONS

Notice of Office Action Korean Patent Application No. 10-2012-0126450 dated Jan. 7, 2014 with English translation.

* cited by examiner

MULTILAYERED CERAMIC CAPACITOR, MOUNTING STRUCTURE OF CIRCUIT BOARD HAVING MULTILAYERED CERAMIC CAPACITOR MOUNTED THEREON, AND PACKING UNIT FOR MULTILAYERED CERAMIC CAPACITOR

CROSS-REFERENCE TO RELATED APPLICATIONS

This application claims the priority of Korean Patent Application No. 10-2012-0126450 filed on Nov. 9, 2012, in the Korean Intellectual Property Office, the disclosure of which is incorporated herein by reference.

BACKGROUND OF THE INVENTION

1. Field of the Invention

The present invention relates to a multilayered ceramic capacitor, a mounting structure of a circuit board having the multilayered ceramic capacitor mounted thereon, a packing unit for the multilayered ceramic capacitor.

2. Description of the Related Art

A multilayered ceramic capacitor, a multilayered chip electronic component, is a chip-type condenser commonly mounted on the printed circuit boards of various electronic products, such as image display devices including a liquid crystal display (LCD) and a plasma display panel (PDP), computers, personal digital assistants (PDAs), mobile phones, and the like, implementing charging and discharging of electricity therein.

Multilayered ceramic capacitors (MLCCs) may be used as components of various electronic products due to a small size, high capacitance, and ease of mountability.

A multilayered ceramic capacitor may have a structure in which a plurality of dielectric layers and a plurality of internal electrodes having different polarities and having the dielectric layers interposed therebetween are alternately laminated with each other.

Since the plurality of dielectric layers have both piezoelectric and electrostrictive properties, a piezoelectric phenomenon may occur, causing vibrations among the internal electrodes when AC or DC voltage is applied to the multilayered ceramic capacitor.

Such vibrations may be transferred through external electrodes of the multilayered ceramic capacitor to a printed circuit board on which the multilayered ceramic capacitor is mounted, and the entire printed circuit board may become an acoustic reflection surface generating sound from the vibrations.

The sound generated by the vibrations may correspond to an audible frequency within the range of 20 to 20000 Hz, and this vibrating sound, frequently causing an unpleasant feeling in people is known as acoustic noise.

In order to reduce acoustic noise, products in which a lower cover layer of the multilayered ceramic capacitor is enlarged have been researched.

In addition, a multilayered ceramic capacitor having a thickened lower cover layer may be mounted on a printed circuit board in a horizontal manner, while the thickened lower cover layer is located below, which may help in reducing acoustic noise.

Here, an image recognition method or the like is used to differentiate directions in which the thin upper cover layer and the thicker lower cover layer of the multilayered ceramic capacitor are mounted. However, the image recognition method or the like requires an excessive amount of cost and time and thus, assembly efficiency of the mounting substrate may be deteriorated.

In the Related Art Documents below, Patent Document 1 fails to disclose a dummy electrode, while Patent Document 2 fails to disclose a lower cover layer thicker than an upper cover layer.

RELATED ART DOCUMENTS (Patent Document 1) Japanese Patent Laid-Open Publication No. 1994-215978
(Patent Document 2) Korean Patent Laid-Open Publication No. 10-2005-0071733

SUMMARY OF THE INVENTION

An aspect of the present invention provides measures capable of reducing noise generated due to vibrations caused due to a piezoelectric phenomenon of a multilayered ceramic capacitor and allowing for differentiation between upper and lower directions of the multilayered ceramic capacitor when the multilayered ceramic capacitor is mounted on a printed circuit board.

According to an aspect of the present invention, there is provided a multilayered ceramic capacitor, including: a ceramic body having a plurality of dielectric layers laminated therein; an active layer including a plurality of first and second internal electrodes having individual dielectric layers interposed therebetween to form capacitance, the first and second internal electrodes being alternately exposed through respective end surfaces of the ceramic body; an upper cover layer formed above the active layer; a lower cover layer formed below the active layer, the lower cover layer being thicker than the upper cover layer; a dummy electrode formed inside at least one of the upper cover layer and the lower cover layer so as to be seen through a top surface or a bottom surface of the ceramic body, regardless of capacitance formation; and first and second external electrodes covering both end surfaces of the ceramic body, wherein, when A is defined as ½ of an overall thickness of the ceramic body, B is defined as a thickness of the lower cover layer, C is defined as ½ of an overall thickness of the active layer, and D is defined as a thickness of the upper cover layer, a ratio of deviation between a center of the active layer and a center of the ceramic body, $(B+C)/A$, satisfies $1.063 \leq (B+C)/A \leq 1.745$.

Here, a ratio of the thickness (D) of the upper cover layer to the thickness (B) of the lower cover layer, D/B, may satisfy $0.021 \leq D/B \leq 0.422$.

Here, a ratio of the thickness (B) of the lower cover layer to ½ (A) of the overall thickness of the ceramic body, B/A, may satisfy $0.329 \leq B/A \leq 1.522$.

Here, a ratio of ½ (C) of the overall thickness of the active layer to the thickness (B) of the lower cover layer, C/B, may satisfy $0.146 \leq C/B \leq 2.458$.

Here, an end portion of the upper cover layer in which the dummy electrode is not formed may have a thickness of 4 μm to 30 μm.

The dummy electrode may be formed adjacently to the top surface of the ceramic body, or may be formed by using an internal electrode having directionality the same as the internal electrode disposed in the uppermost portion of the active layer.

Here, an end portion of the lower cover layer in which the dummy electrode is not formed may have a thickness of 4 μm to 30 μm.

The dummy electrode may be formed adjacently to the bottom surface of the ceramic body, or may be formed by using an internal electrode having directionality the same as the internal electrode disposed in the lowermost portion of the active layer.

The dummy electrode may be formed inside both of the upper cover layer and the lower cover layer, and the dummy electrodes formed inside the upper cover layer and the lower cover layer may have different shapes such that upper and lower directions thereof are easily differentiated from each other.

The dummy electrode may include a first dummy electrode exposed through one end surface of the upper or lower cover layer and a second dummy electrode exposed through the other end surface of the upper or lower cover layer, the first dummy electrode and the second dummy electrode being opposite to each other on the same horizontal plane with an interval therebetween.

The dummy electrode may be spaced apart from both end surfaces of the upper or lower cover layer.

The dummy electrode may have a length such that the dummy electrode partially overlaps portions of the first and second external electrodes covering at least portions of the top and bottom surfaces of the ceramic body, in a thickness direction thereof, or may have a length such that the dummy electrode does not overlap portions of the first and second external electrodes covering the at least portions of the top and bottom surfaces of the ceramic body, in a thickness direction thereof.

The multilayered ceramic capacitor may further include a dummy electrode formed in a portion of the lower cover layer, close to a lower end of the active layer, regardless of capacitance formation.

The dummy electrode formed in the portion of the lower cover layer, close to the lower end of the active layer, may be formed by using an internal electrode opposite to the dummy electrode formed inside the upper cover layer.

Here, points of inflection formed on respective end surfaces of the ceramic body may be formed to have a height corresponding to or lower than a center of the ceramic body in the thickness direction, due to a difference between a deformation rate occurring in the center of the active layer and a deformation rate occurring in the lower cover layer, during the application of voltage thereto.

According to another aspect of the present invention, there is provided a mounting structure of a circuit board having a multilayered ceramic capacitor mounted thereon, the mounting structure including: a printed circuit board having first and second electrode pads formed thereon; and a multilayered ceramic capacitor mounted on the printed circuit board, wherein the multilayered ceramic capacitor includes: a ceramic body having a plurality of dielectric layers laminated therein; an active layer including a plurality of first and second internal electrodes having individual dielectric layers interposed therebetween to form capacitance, the first and second internal electrodes being alternately exposed through respective end surfaces of the ceramic body; an upper cover layer formed above the active layer; a lower cover layer formed below the active layer, the lower cover layer being thicker than the upper cover layer; a dummy electrode formed inside at least one of the upper cover layer and the lower cover layer so as to be seen through a top surface or a bottom surface of the ceramic body, regardless of capacitance formation; and first and second external electrodes formed on both end surfaces of the ceramic body and Soldering-connected to first and second electrode pads, and wherein, when A is defined as ½ of an overall thickness of the ceramic body, B is defined as a thickness of the lower cover layer, C is defined as ½ of an overall thickness of the active layer, and D is defined as a thickness of the upper cover layer, a ratio of deviation between a center of the active layer and a center of the ceramic body, (B+C)/A, satisfies $1.063 \leq (B+C)/A \leq 1.745$.

Here, points of inflection formed on respective end surfaces of the ceramic body may be formed to have a height corresponding to or lower than soldering, due to a difference between a deformation rate occurring in the center of the active layer and a deformation rate occurring in the lower cover layer, during the application of voltage thereto.

According to another aspect of the present invention, there is provided a packing unit for a multilayered ceramic capacitor, the packing unit including: one or more multilayered ceramic capacitors, the one or more multilayered ceramic capacitors including: a ceramic body having a plurality of dielectric layers laminated therein; an active layer including a plurality of first and second internal electrodes having individual dielectric layers interposed therebetween, the first and second internal electrodes being alternately exposed through respective end surfaces of the ceramic body; an upper cover layer formed above the active layer; a lower cover layer formed below the active layer, the lower cover layer being thicker than the upper cover layer; a dummy electrode formed inside at least one of the upper cover layer and the lower cover layer so as to be seen through a top surface or a bottom surface of the ceramic body, regardless of capacitance formation; and first and second external electrodes formed on both end surfaces of the ceramic body and electrically connected to exposed portions of the first and second internal electrodes, wherein when A is defined as ½ of an overall thickness of the ceramic body, B is defined as a thickness of the lower cover layer, C is defined as ½ of an overall thickness of the active layer, and D is defined as a thickness of the upper cover layer, a ratio of deviation between a center of the active layer and a center of the ceramic body, (B+C)/A, satisfies $1.063 \leq (B+C)/A \leq 1.745$; and a packing sheet having a plurality of receiving parts in which the multilayered ceramic capacitors are respectively received, the lower cover layer of the multilayered ceramic capacitor facing a bottom surface of the receiving part.

The packing unit may further include a packing film attached to one surface of the packing sheet so as to seal the receiving parts in which the multilayered ceramic capacitors are respectively received.

The packing sheet may be wound as a reel.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
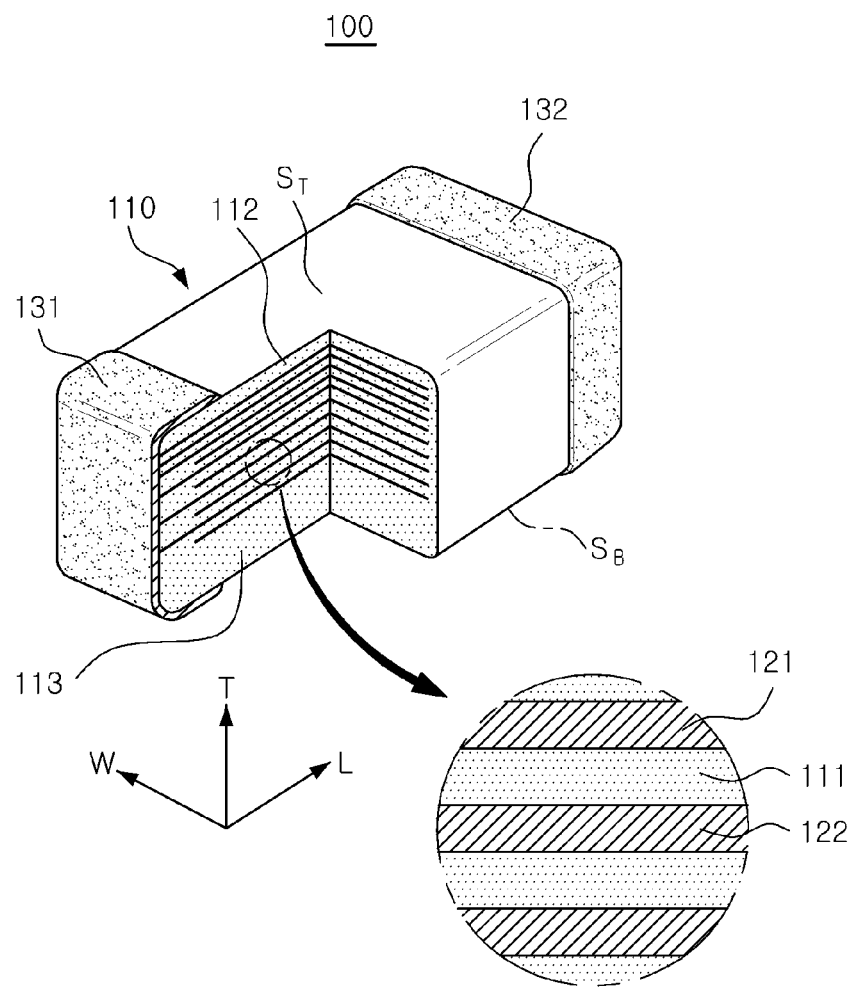
FIG. 1 is a partially cutaway perspective view schematically showing a multilayered ceramic capacitor according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

When directions of a hexahedron are defined in order to clearly describe embodiments of the present invention, L, W, and T directions, shown in the drawings, indicate length, width, and thickness directions, respectively. Here, the thickness direction may be used to have the same concept as a lamination direction in which dielectric layers are laminated.

In addition, in the present embodiments, end surfaces of a ceramic body in a length direction thereof, on which first and second external electrodes are formed, are defined as both end surfaces, and surfaces perpendicular to the end surfaces are defined as side surfaces.

Multilayered Ceramic Capacitor

Figure 2:
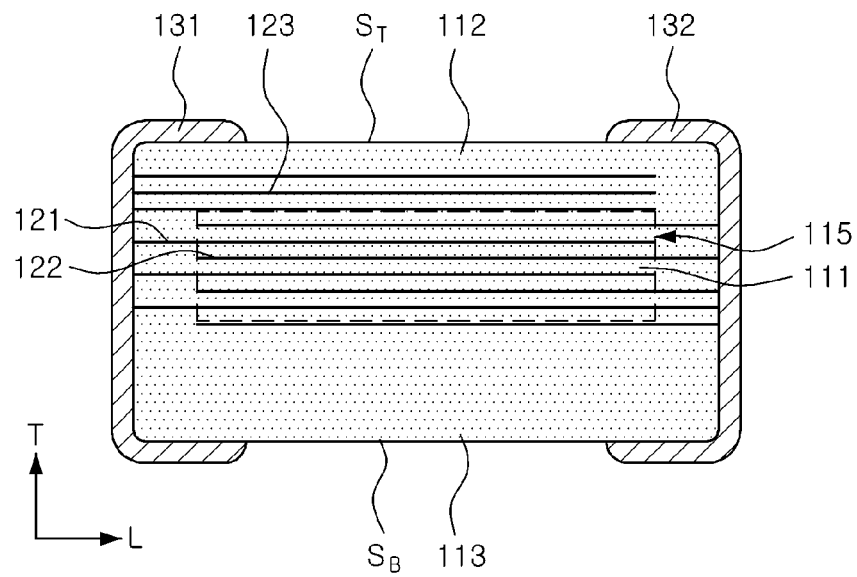
FIG. 2 is a cross-sectional view showing the multilayered ceramic capacitor of FIG. 1, cut in the length direction thereof.

Referring to FIGS. 1 and 2, a multilayered ceramic capacitor 100 according to an embodiment of the present invention may include a ceramic body 110, an active layer 115 having first and second internal electrodes 121 and 122, upper and lower cover layers 112 and 113, and first and second external electrodes 131 and 132 formed to cover both end surfaces of the ceramic body 110. One or more dummy electrodes 123 allowing upper and lower directions to be distinguished may be formed inside the upper cover layer 112 regardless of capacitance formation.

The ceramic body 110 may be formed by laminating and firing a plurality of dielectric layers 111. The shapes, dimensions, and the number of stacked dielectric layers 111, of the ceramic body 110 are not limited to those described in the present embodiment.

The plurality of dielectric layers 111 constituting the ceramic body 110 are in a sintered state, and boundaries between adjacent dielectric layers 111 may be integrated such that they may not be readily apparent without the use of a scanning electron microscope (SEM).

The ceramic body 110 may be composed of the active layer 115 contributing to capacitance formation and the upper cover layer 112 and the lower cover layer 113 as margin parts, formed above and below the active layer 115.

The active layer 115 may be formed by repeatedly laminating a plurality of first and second internal electrodes 121 and 122 with the dielectric layer 111 between the first internal electrode and the second internal electrode.

Here, the thickness of the dielectric layer 111 may be optionally changed according to the design of capacitance of the multilayered ceramic capacitor 100, and the thickness of one layer may be 0.01 to 1.00 µm after firing, but the present invention is not limited thereto.

In addition, the dielectric layer 111 may contain ceramic powder having a high dielectric constant, for example, barium titanate ($BaTiO_3$) based powder or strontium titanate ($SrTiO_3$) based powder, but the present invention is not limited thereto.

The upper cover layer 112 and the lower cover layer 113 may have the same material and constitution as the dielectric layer 111, except that the internal electrodes are not included therein.

The upper cover layer 112 and the lower cover layer 113 may be formed by laminating a single dielectric layer or two or more dielectric layers on upper and lower surfaces of the active layer 115 in upper and lower directions, respectively. The upper cover layer 112 and the lower cover layer 113 may basically serve to prevent damage of the first and second internal electrodes 121 and 122 due to physical or chemical stress.

In addition, the lower cover layer 113 may be thicker than the upper cover layer 112 by further increasing the number of laminated dielectric layers as compared with the upper cover layer 112.

The dummy electrodes 123 may be formed inside the upper cover layer 112 by laminating one or more layers in a thickness direction of the ceramic body 110 such that they are seen through a top surface ($S_T$) of the ceramic body 110.

For this reason, the top surface ($S_T$) of the ceramic body 110 in which the upper cover layer 112 is formed and a bottom surface ($S_B$) of the ceramic body 110 in which the lower cover layer 113 is formed may be clearly differentiated from each other. Therefore, the upper and lower directions of the multilayered ceramic capacitor 100 may be easily differentiated from each other when the multilayered ceramic capacitor is mounted on a printed circuit board, so that the multilayered ceramic capacitor may be prevented from being mounted upside down, thereby improving assembly efficiency of a mounting substrate and decreasing the amount of defective mounting substrates produced.

Here, an end portion of the upper cover layer 112, in which the dummy electrode 123 is not formed, may have a minimum thickness (E) within the reliable range so that the dummy electrode 123 is easily seen through the top surface ($S_T$) of the ceramic body 110.

In addition, the dummy electrode 123 disposed in the uppermost portion of the upper cover layer 112 may be formed as closely as possible to the top surface ($S_T$) of the ceramic body 110 inside the upper cover layer 112 such that the dummy electrode 123 is easily seen through the top surface ($S_T$) of the ceramic body 110.

The dummy electrode 123 may be formed by using an internal electrode having directionality the same as that of the first internal electrode 121 located at the uppermost portion of the active layer 115. The dummy electrodes 123 may not be a structure in which internal electrodes having different polarities overlap each other, having a dielectric layer interposed therebetween.

Therefore, the dummy electrodes 123 do not contribute to capacitance formation except for parasitic capacitance generated due to effects of the external electrodes 131 and 132 formed on both ends of the ceramic body 110 in the length direction of the ceramic body 110 or the active layer 115 for forming capacitance.

Meanwhile, in the present embodiment, the dummy electrode 123 is shown as an internal electrode having directionality the same as the first internal electrode 121 located in the uppermost portion of the active layer 115. However, the structure of the dummy electrodes according to the embodiment of the invention may be variously changed as necessary, and the present invention is not limited thereto.

Various modifications of the dummy electrode will be described in detail with reference to the drawings according to another embodiment of the invention below.

The first and second internal electrodes 121 and 122 are a pair of electrodes having different polarities, and may be formed by printing conductive paste containing conductive metal at a predetermined thickness on the dielectric layers 111 such that the first and second internal electrodes 121 and 122 are alternately exposed through both end surfaces of the ceramic body in a lamination direction in which the dielectric layers 111 are stacked. The first and second internal electrodes 121 and 122 may be electrically insulated from each other by the dielectric layers 111 disposed therebetween.

That is, the first and second internal electrodes 121 and 122 may be electrically connected to the first and second external electrodes 131 and 132 through portions thereof alternately exposed through both end surfaces of the ceramic body 110.

Therefore, when voltages are applied to the first and second external electrodes 131 and 132, charges are stored between the first and second internal electrodes 121 and 122 facing each other. Here, the capacitance of the multilayered ceramic capacitor 100 may be proportional to the area of an overlapping region of the first and second internal electrodes 121 and 122.

The thickness of each of the first and second internal electrodes 121 and 122 may be determined depending on the usage thereof, and for example, may be determined within a range of 0.2 to 1.0 μm in consideration of the size of the ceramic body 110. However, the present invention is not limited thereto.

In addition, conductive metal contained in the conductive paste for forming the first and second internal electrodes 121 and 122 may be nickel (Ni), copper (Cu), palladium (Pd), or an alloy thereof, but the present invention is not limited thereto.

In addition, the conductive paste may be printed by a screen printing method, a gravure printing method, or the like, but the present invention is not limited thereto.

The first and second external electrodes 131 and 132 may be formed of a conductive paste containing a conductive metal. The conductive metal may be nickel (Ni), copper (Cu), palladium (Pd), gold (Au), or an alloy thereof, but the present invention is not limited thereto.

Hereinafter, the relationship between dimensions of components included in the multilayered ceramic capacitor according to the present embodiment and acoustic noise will be described.

Figure 3:
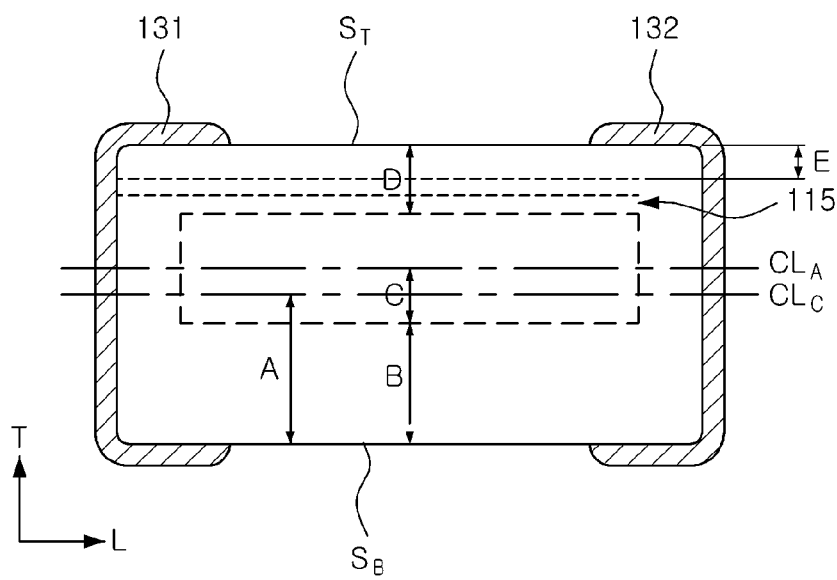
FIG. 3 is a cross-sectional view schematically showing the multilayered ceramic capacitor of FIG. 1, cut in the length direction thereof, to illustrate dimensional relationships among components included in the multilayered ceramic capacitor.

Referring to FIG. 3, A is defined as ½ of an overall thickness of the ceramic body 110, B is defined as a thickness of the lower cover layer 113, C is defined as ½ of an overall thickness of the active layer 115, D is defined as a thickness of the upper cover layer 112, and E is defined as a thickness of a portion of the upper cover layer 112 in which the dummy electrode 123 is not formed.

Here, the overall thickness of the ceramic body 110 refers to a distance between the top surface ($S_T$) and the bottom surface ($S_B$) of the ceramic body 110. The overall thickness of the active layer 115 refers to a distance between an upper surface of the first internal electrode 121 located at the uppermost portion of the active layer 115 to a lower surface of the second internal electrode 122 located at the lowermost portion of the active layer 115.

In addition, the thickness of the lower cover layer 113 (B) refers to a distance between a lower surface of the second internal electrode 122 located at the lowermost portion in the thickness direction of the active layer 115 to the bottom surface ($S_B$) of the ceramic body 110, and the thickness of the upper cover layer 112 (D) refers to a distance between an upper surface of the first internal electrode 121 located at the uppermost portion in the thickness direction of the active layer 115 to the top surface ($S_T$) of the ceramic body 110.

When voltages having different polarities are applied to the first and second external electrodes 131 and 132 formed on both ends of the multilayered ceramic capacitor 100, the ceramic body 110 expands and shrinks in the thickness direction thereof due to an inverse piezoelectric effect of the dielectric layers 111, and both ends of the first and second external electrodes 131 and 132 expand and shrink, contrary to the expansion and shrinkage of the ceramic body 110 in the thickness direction of the ceramic body 110, due to the Poisson effect.

Here, a center of the active layer 115 may correspond to portions of the first and second external electrodes 131 and 132 corresponding to both ends of the multilayered ceramic capacitor in the length direction thereof in which significant expansion and shrinkage occur, which becomes a factor causing acoustic noise.

That is, in the present embodiment, in order to reduce acoustic noise, points of inflection (PI) formed on respective end surfaces of the ceramic body 110 may be formed to have a height corresponding to or lower than a center ($CL_C$) of the thickness of the ceramic body 110, due to a difference between a deformation rate occurring in the center ($CL_A$) of the active layer 115 and a deformation rate occurring in the lower cover layer 113, during the application of voltage thereto.

Here, in order to further reduce acoustic noise, a ratio of deviation between the center ($CL_A$) of the active layer 115 and the center ($CL_C$) of the ceramic body 110, (B+C)/A, may satisfy $1.063 \leq (B+C)/A \leq 1.745$.

In addition, the ratio of the thickness (D) of the upper cover layer 112 to the thickness (B) of the lower cover layer 113, D/B, may satisfy $0.021 \leq D/B \leq 0.422$.

In addition, the ratio of the thickness (B) of the lower cover layer 113 to ½ (A) of the thickness of the ceramic body 110, B/A, may satisfy $0.329 \leq B/A \leq 1.522$.

In addition, the ratio of ½ (C) of the thickness of the active layer 115 to the thickness (B) of the lower cover layer 113, C/B, may satisfy $0.146 \leq C/B \leq 2.458$.

Experimental Example

Multilayered ceramic capacitors according to the inventive examples and comparative examples of the present invention were manufactured as follows.

A slurry including a powder of, for example, barium titanate ($BaTiO_3$) or the like, was coated and dried on carrier films, to prepare a plurality of ceramic green sheets having a thickness of 1.8 μm.

Then, a conductive paste for a nickel internal electrode was coated on the ceramic green sheets by using a screen, to form internal electrodes.

The ceramic green sheets were laminated in an amount of about 370 layers while ceramic green sheets not having internal electrodes formed thereon, rather than the ceramic green sheets having internal electrodes formed thereon, were laminated in greater numbers in a lower part of the laminate than in an upper part thereof. This laminate was subjected to isostatic pressing at 85° C. in the pressure conditions of 1000 kgf/cm².

The ceramic laminate after completion of pressing was cut into individual chips, and then the cut chip was subjected to debindering at 230° C. in the air atmosphere for 60 hours.

After that, the resultant chip was fired in the reducing atmosphere under an oxygen partial pressure of $10^{-11}$ atm to $10^{-10}$ atm, lower than the equilibrium oxygen partial pressure of Ni/NiO, such that the internal electrodes are not oxidized, at 1200° C. The chip size of a multilayered chip capacitor after firing was about 1.64 mm×0.88 mm (L×W, 1608 size). Here, the tolerance was within a range of ±0.1 mm in length× width (L×W), and when the range is satisfied, acoustic noise was measured by experimentation.

Then, an external electrode forming process, a plating process, and the like were carried out to manufacture multilayered ceramic capacitors.

TABLE 1

| Sample | A (μm) | B (μm) | C (μm) | D (μm) | (B + C)/A | B/A | D/B | C/B | AN (dB) | Capacitance Implementation Ratio |
|---|---|---|---|---|---|---|---|---|---|---|
| 1* | 405.5 | 40.2 | 365.4 | 39.9 | 1.000 | 0.099 | 0.993 | 9.090 | 29.5 | OK |
| 2* | 436.0 | 70.4 | 365.9 | 69.7 | 1.001 | 0.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.605 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16 | 431.7 | 94.8 | 364.3 | 40.0 | 1.063 | 0.220 | 0.422 | 3.843 | 19.9 | OK |
| 17 | 443.0 | 103.8 | 389.1 | 4.0 | 1.113 | 0.234 | 0.039 | 3.749 | 19.3 | OK |
| 18 | 443.7 | 119.8 | 363.2 | 41.1 | 1.089 | 0.270 | 0.343 | 3.032 | 18.7 | OK |
| 19 | 447.1 | 147.3 | 362.1 | 22.7 | 1.139 | 0.329 | 0.154 | 2.458 | 17.9 | OK |
| 20 | 452.8 | 164.7 | 360.2 | 20.4 | 1.159 | 0.364 | 0.124 | 2.187 | 17.3 | OK |
| 21 | 448.7 | 170.3 | 361.0 | 5.1 | 1.184 | 0.380 | 0.030 | 2.120 | 17.2 | OK |
| 22 | 470.7 | 170.4 | 365.4 | 40.2 | 1.138 | 0.362 | 0.236 | 2.144 | 17.4 | OK |
| 23 | 491.9 | 220.3 | 360.8 | 41.8 | 1.181 | 0.448 | 0.190 | 1.638 | 16.9 | OK |
| 24 | 500.6 | 270.2 | 360.5 | 9.9 | 1.260 | 0.540 | 0.037 | 1.334 | 16.8 | OK |
| 25 | 516.9 | 270.4 | 361.8 | 39.7 | 1.223 | 0.523 | 0.147 | 1.338 | 16.7 | OK |
| 26 | 502.1 | 364.9 | 312.3 | 14.7 | 1.349 | 0.727 | 0.040 | 0.856 | 16.6 | OK |
| 27 | 407.5 | 421.8 | 189.1 | 14.9 | 1.499 | 1.035 | 0.035 | 0.448 | 16.6 | OK |
| 28 | 445.8 | 493.3 | 179.3 | 39.7 | 1.509 | 1.107 | 0.080 | 0.363 | 16.5 | OK |
| 29 | 483.7 | 632.0 | 160.1 | 15.2 | 1.638 | 1.307 | 0.024 | 0.253 | 16.4 | OK |
| 30 | 520.0 | 643.4 | 190.7 | 15.2 | 1.604 | 1.237 | 0.024 | 0.296 | 16.4 | OK |
| 31 | 486.4 | 685.3 | 121.1 | 45.3 | 1.658 | 1.409 | 0.066 | 0.177 | 16.4 | OK |
| 32 | 507.2 | 742.7 | 120.8 | 30.1 | 1.702 | 1.464 | 0.041 | 0.163 | 16.4 | OK |
| 33 | 515.2 | 773.9 | 118.2 | 20.1 | 1.732 | 1.502 | 0.026 | 0.153 | 16.4 | OK |
| 34 | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.3 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

*Comparative Example,
AN: acoustic noise

Table 1 above shows dimension data of respective parts of the multilayered ceramic capacitor 100, measured based on an image obtained by scanning a cross-section of the ceramic body 110, cut in the length direction (L) and the thickness direction (T) in the central portion of the ceramic body 110 of the multilayered ceramic capacitor 100 in the width (W) direction thereof, using a scanning electron microscope (SEM), as shown in FIG. 3.

Here, as described above, A was defined as ½ of an overall thickness of the ceramic body 110, B was defined as a thickness of the lower cover layer 113, C was defined as ½ of an overall thickness of the active layer 115, and D was defined as a thickness of the upper cover layer 112.

In order to measure acoustic noise, one sample (multilayered chip capacitor) per a substrate for measuring acoustic noise was mounted on a printed circuit board while upper and lower directions of the sample were differentiated from each other, and then the printed circuit board was seated on a measuring jig.

In addition, DC voltage and voltage variations were applied to both terminals of the sample seated on the measuring jig by using a DC power supply and a function generator. Acoustic noise was measured through a microphone installed directly above the printed circuit board.

In Table 1 above, Samples 1 to 3 are comparative examples having a symmetrical cover structure in which the thickness (B) of the lower cover layer 113 is approximately similar to the thickness (D) of the upper cover layer 112, and Samples 4 to 13 are comparative examples having a structure in which the thickness (D) of the upper cover layer 112 is thicker than the thickness (B) of the lower cover layer 113.

In addition, Samples 14, 15, and 35 to 37 are comparative examples having a structure in which the thickness (B) of the lower cover layer 113 is thicker than the thickness (D) of the upper cover layer 112, and Samples 16 to 34 are inventive examples according to the embodiment of the invention.

Here, in the case in which the (B+C)/A value is approximately 1, the center of the active layer 115 does not largely deviate from the center of the ceramic body 110. In Samples 1 to 3 having a symmetrical cover structure in which the thickness (B) of the lower cover layer 113 is approximately similar to the thickness (D) of the upper cover layer 112, the (B+C)/A values thereof are approximately 1.

In the case in which the (B+C)/A value is greater than 1, the center of the active layer 115 upwardly deviates from the center of the ceramic body 110. When the (B+C)/A value is smaller than 1, the center of the active layer 115 downwardly deviates from the center of the ceramic body 110.

Referring to Table 1 above, in Samples 16 to 34 in which the ratio of deviation between the center of the active layer 115 from the center of the ceramic body 110, (B+C)/A, satisfies 1.063≤(B+C)/A≤1.745, it can be confirmed that acoustic noise values thereof were significantly reduced to below 20 dB.

In addition, Samples 1 to 15 in which the ratio of deviation between the center of the active layer 115 and the center of the ceramic body 110, (B+C)/A, is below 1.063, has a structure in which the center of the active layer 115 scarcely deviates from the center of the ceramic body 110 or the center of the active layer 115 downwardly deviates from the center of the ceramic body 110.

In the forgoing samples 1 to 15 of which the (B+C)/A value is below 1.063, acoustic noise values thereof were 25 to 32.5 dB, and thus it can be confirmed that the samples 1 to 15 had no effect of reducing acoustic noise as compared with the inventive examples according to the embodiment of the present invention.

In addition, in Samples 35 to 37 in which the ratio of deviation between the center of the active layer 115 and the center of the ceramic body 110, (B+C)/A, is above 1.745, the capacitance in comparison with the target capacitance was low, causing defective capacitance.

In Table 1 above, in the case that "NG" is marked in the column "Capacitance Implementation Ratio" (that is, the ratio of capacitance to target capacitance), the value of capacitance to target capacitance is below 80% when the target capacitance value is 100%.

In addition, in the inventive examples in which the ratio of the thickness (D) of the upper cover layer 112 to the thickness (B) of the lower cover layer 113, D/B, satisfies 0.021≤D/B≤0.422, it can be confirmed that acoustic noise was significantly reduced.

Whereas, in the comparative examples in which the ratio of the thickness (D) of the upper cover layer 112 to the thickness (B) of the lower cover layer 113, D/B, is above 0.422, it can be confirmed that there was no effect in reducing acoustic noise.

When the ratio of the thickness (D) of the upper cover layer 112 to the thickness (B) of the lower cover layer 113, D/B, is below 0.021, the thickness (B) of the lower cover layer 113 is excessively greater than the thickness (D) of the upper cover layer 112, resulting in cracking or delamination, and the capacitance in comparison with target capacitance is low, causing defective capacitance.

In Samples 19 to 34 of the inventive examples in which the ratio of the thickness (B) of the lower cover layer 113 to the thickness (A) of the ceramic body 110, B/A, and the ratio of the thickness (C) of the active layer 115 to the thickness (B) of the lower cover layer 113, C/B, satisfy, 0.329≤B/A≤1.522 and 0.146≤C/B≤2.458, it can be confirmed that acoustic noise values therefor were further decreased to below 18 dB.

Whereas, in Samples 35 to 37 in which the ratio of the thickness (B) of the lower cover layer 113 to the thickness (A) of the ceramic body 110, B/A, is above 1.522 or the ratio of the thickness (C) of the active layer 115 to the thickness (B) of the lower cover layer 113, C/B, is below 0.146, it can be confirmed that capacitance, in comparison with target capacitance, was low, causing defective capacitance.

Table 2 below shows whether or not the dummy electrodes 123 were seen through the top surface ($S_T$) of the ceramic body 110 according to the thickness (E) of an end portion of the upper cover layer 112 in which the dummy electrode 123 is not formed.

TABLE 2

| Sample | Thickness (A) (μm) | Thickness (B) (μm) | Thickness (C) (μm) | Thickness (D) (μm) | Thickness (E) (μm) | Seen or not Through Upper Surface of Ceramic Body | Acoustic Noise (dB) |
|---|---|---|---|---|---|---|---|
| 1 | 40.1 | 250.4 | 40.1 | 510.5 | 4.00 | o | 16.8 |
| 2 | 39.8 | 249.7 | 39.8 | 508.3 | 8.98 | o | 16.9 |
| 3 | 40.0 | 251.2 | 40.0 | 509.4 | 14.1 | o | 16.9 |
| 4 | 40.0 | 250.8 | 40.0 | 509.8 | 24.20 | o | 16.8 |
| 5 | 40.1 | 250.3 | 40.1 | 509.2 | 29.90 | o | 16.7 |
| 6 | 40.4 | 250.9 | 40.4 | 510.6 | 35.40 | x | 16.8 |

Referring to Table 2 above, when the thickness (E) of the end portion of the upper cover layer 112 in which the dummy electrode 123 is not formed was above 30 μm, it was not easily determined whether or not the dummy electrodes 123 were seen through the top surface ($S_T$) of the ceramic body 110.

In addition, when the thickness (E) of the end portion of the upper cover layer 112 in which the dummy electrode 123 is not formed is below 4 μm, the dummy electrode 123 may be exposed to the outside due to infiltration of moisture from the outside or external impact, resulting in deteriorating reliability.

Therefore, the thickness (E) of the end portion of the upper cover layer 112 in which the dummy electrode 123 is not formed may be 4 μm to 30 μm.

In addition, the dummy electrode 123 formed in the uppermost portion of the upper cover layer 112 may be formed as closely as possible to the top surface ($S_T$) of the ceramic body 110 inside the upper cover layer 112 such that the dummy electrode 123 is easily seen through the top surface ($S_T$) of the ceramic body 10.

In addition, the acoustic noise values were below 17 dB for all the samples, and thus it can be confirmed that the effect of reducing acoustic noise due to the lower cover layer 113 was still present in spite of insertion of the dummy electrodes 123.

Figure 4:
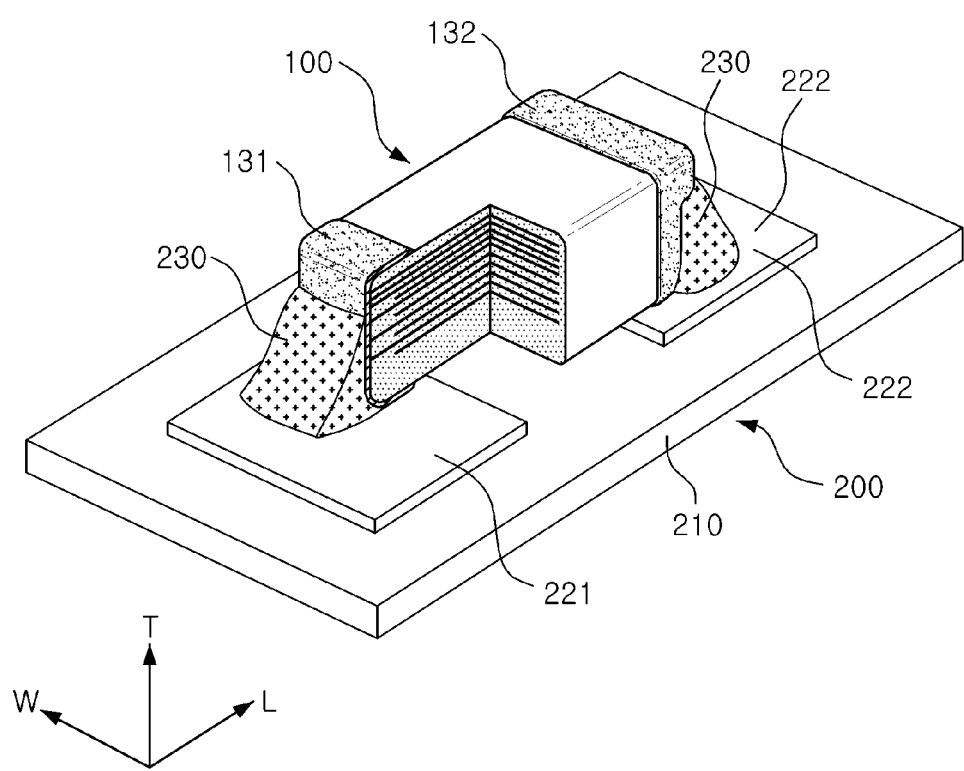
FIG. 4 is a partially cutaway perspective view showing a state in which the multilayered ceramic capacitor of FIG. 1 is mounted on a printed circuit board.
Figure 5:
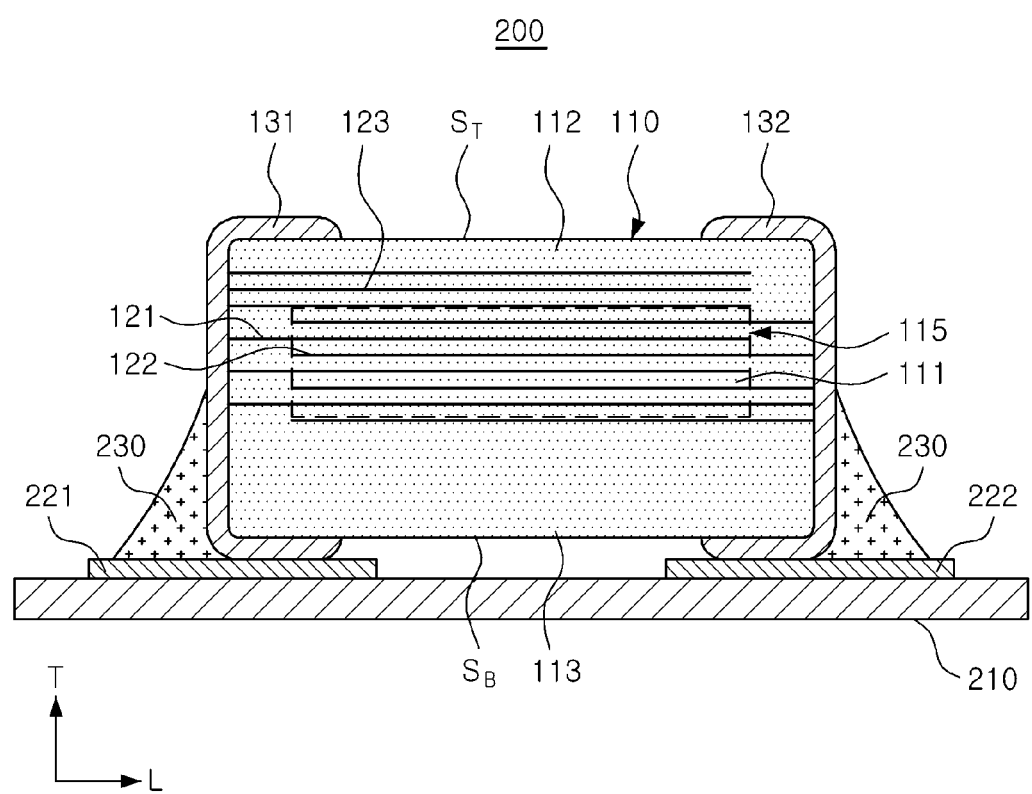
FIG. 5 is a cross-sectional view showing the multilayered ceramic capacitor and printed circuit board of FIG. 4, cut in the length direction thereof.

Mounting Structure of Circuit Board Having Multilayered Ceramic Capacitor Mounted Thereon Referring to FIGS. 4 and 5, a mounting board 200 for the multilayered ceramic capacitor 100 according to the present embodiment may include a printed circuit board 210 on which the multilayered ceramic capacitor 100 is horizontally mounted; and first and second electrode pads 221 and 222 spaced apart from each other on an upper surface of the printed circuit board 210.

Here, the multilayered ceramic capacitor 100 may be electrically connected to the printed circuit board 210 by soldering 230 while the lower cover layer 113 is located below and the first and second external electrodes 131 and 132 are positioned on and contacted with the first and second electrode pads 221 and 222, respectively.

When voltage is applied while the multilayered ceramic capacitor 100 is mounted on the printed circuit board 210 as described above, acoustic noise may be generated.

Here, the size of the first and second electrode pads 221 and 222 may be an index for determining the amount of soldering 230 which connects the first and second external electrodes 131 and 132 of the multilayered ceramic capacitor 100 and the first and second electrode pads 221 and 222, and the level of acoustic noise may be controlled depending on the amount of soldering 230.

Figure 6:
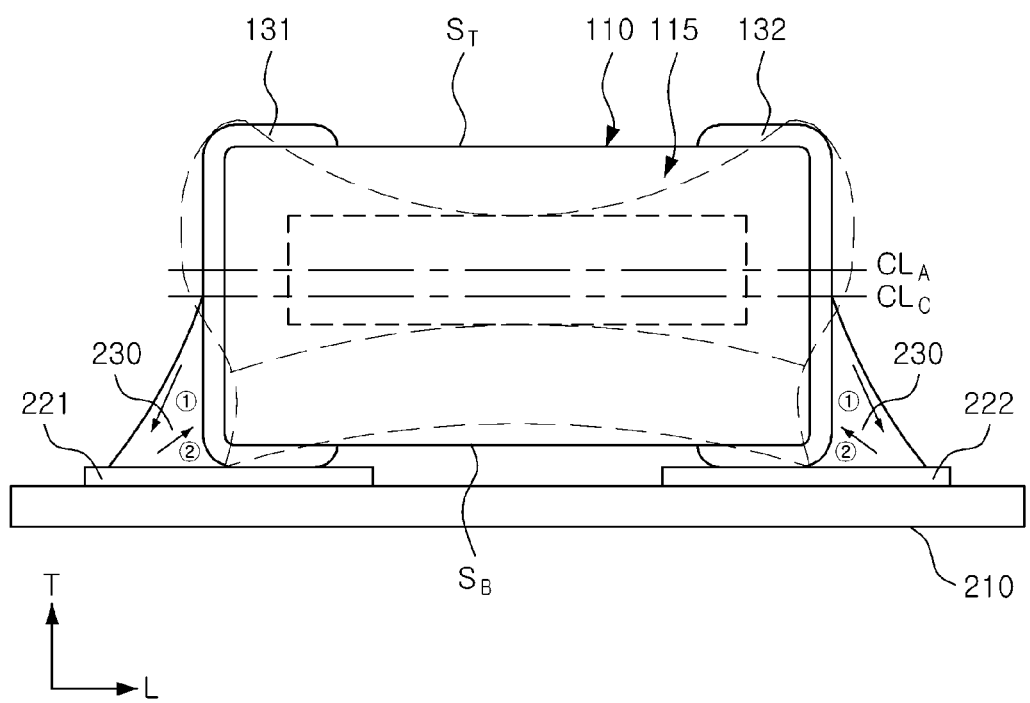
FIG. 6 is a cross-sectional view schematically showing a state in which the multilayered ceramic capacitor of FIG. 4 is transformed due to the application of voltage when the multilayered ceramic capacitor is mounted on the printed circuit board.

Referring to FIG. 6, when voltages having different polarities are applied to the first and second external electrodes 131 and 132 formed on both ends of the multilayered ceramic capacitor 100 while the multilayered ceramic capacitor 100 is mounted on the printed circuit board 210, the ceramic body 110 expands and shrinks in the thickness direction thereof due to an inverse piezoelectric effect of the dielectric layers 111, and both ends of the first and second external electrodes 131 and 132 expand and shrink, contrary to the expansion and shrinkage of the ceramic body 110 in the thickness direction, due to the Poisson effect.

Here, a center of the active layer 115 corresponds to portions of the first and second external electrodes 131 and 132 corresponding to both ends of the multilayered ceramic capacitor in the length direction thereof in which significant expansion and shrinkage occur, and this becomes a factor causing acoustic noise.

When both end surfaces in the length direction of the multilayered ceramic capacitor 100 significantly expands, a force (①) of allowing an upper portion of the soldering 230 to be pushed out to the outside is generated due to expansion and a shrinkage force (②) of allowing a lower portion of the soldering 230 to be pushed to the external electrode is generated due to the force (①).

Therefore, when points of inflection formed on respective end surfaces of the ceramic body 110 is formed to have a height corresponding to or lower than the soldering 230 due to a difference between a deformation rate occurring in a center of the active layer 115 ($CL_A$) and a deformation rate occurring in the lower cover layer 113, during the application of voltage thereto, acoustic noise may be further reduced.

Packing Unit for Multilayered Ceramic Capacitor

Figure 7:
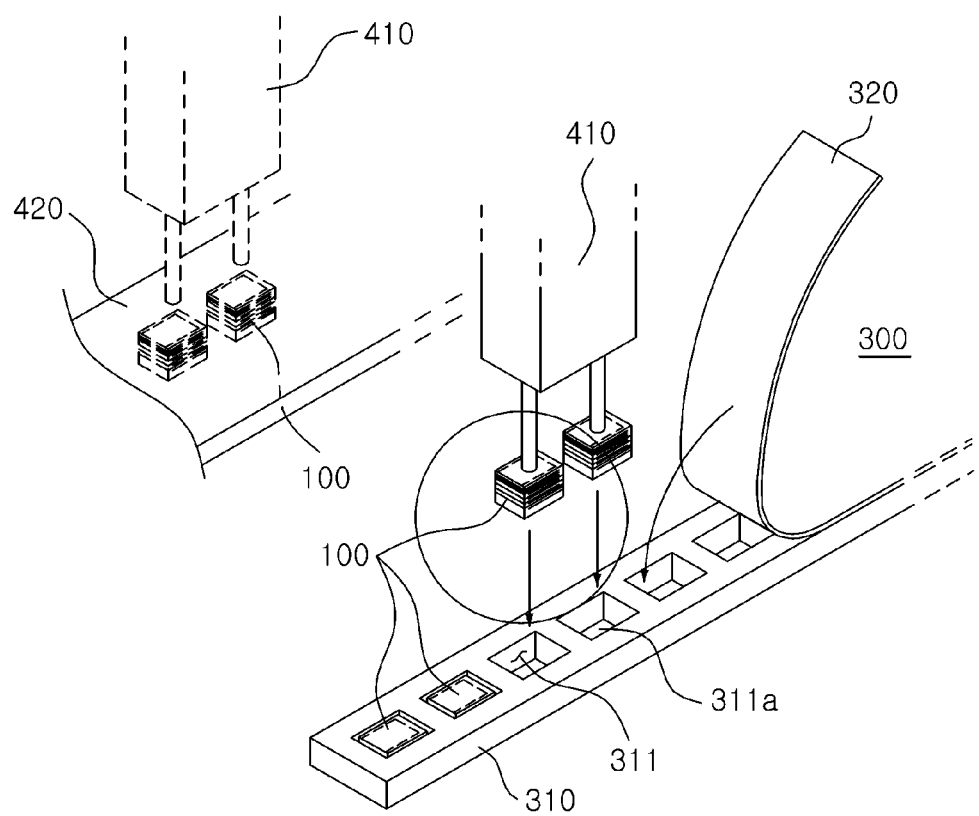
FIG. 7 is a perspective view schematically showing a state in which the multilayered ceramic capacitor according to the embodiment of the present invention is mounted on a packing unit.

Referring to FIG. 7, a packing unit 300 for a multilayered chip capacitor according to the present embodiment may include a packing sheet 310 having a plurality of receiving parts 311 formed to correspond to multilayered ceramic capacitors 100 so as to receive the multilayered ceramic capacitors 100 therein, respectively.

Here, the respective multilayered ceramic capacitors 100 are maintained by an electronic product arranging apparatus 420 such that the first and second internal electrodes 121 and 122 are horizontally arranged, and may be conveyed to the packing sheet 310 by using a conveying apparatus 410.

The thus conveyed multilayered ceramic capacitors 100 may be received in the receiving parts 311 such that respective lower cover layers 113 of the multilayered ceramic capacitors 100 face a bottom surface 311a of the receiving part 311.

In addition, a packing film 320 may be attached to one surface of the packing sheet 310 so as to seal the receiving parts 311 in which the multilayered ceramic capacitors 100 are respectively received.

Figure 8:
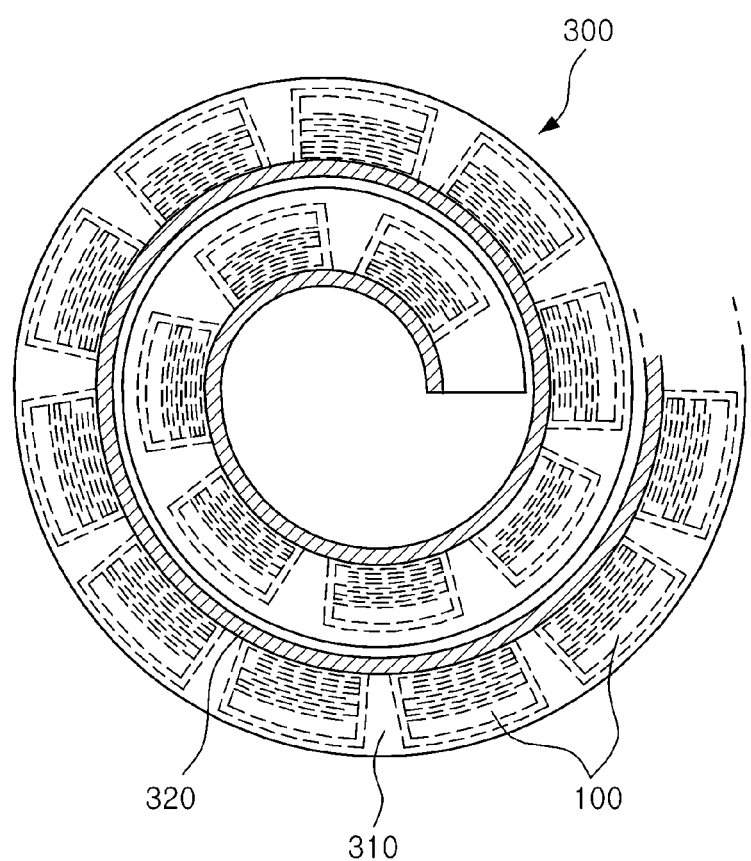
FIG. 8 is a cross-sectional view schematically showing a state in which the packing unit of FIG. 7 is wound as a reel.

Meanwhile, referring to FIG. 8, the thusly formed packing sheet 310 may be continuously wound as a reel.

Modifications of Dummy Electrodes

Figure 9:
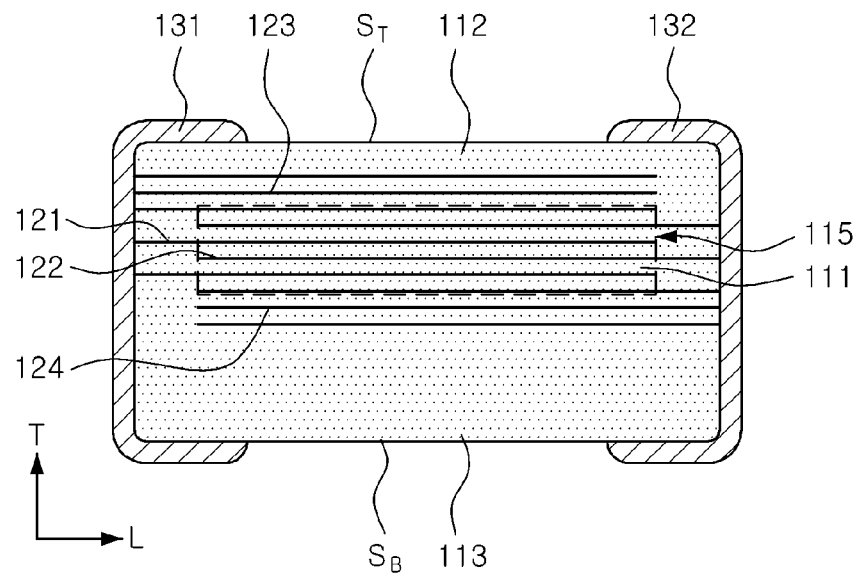
FIGS. 9 through 13 are cross-sectional views of multilayered ceramic capacitors according to embodiments of the present invention, respectively cut in the length direction thereof.

FIG. 9 is a schematic view showing a multilayered ceramic capacitor according to another embodiment of the present invention.

As described in the above embodiment, in the case in which the multilayered ceramic capacitor is manufactured to have an asymmetrical structure in which an upper cover layer 112 and a lower cover layer 113 have different thicknesses, and a dummy electrode 123 is only formed in the upper cover layer 112, as described in the above embodiment, the occurrence of delamination or cracks may be increased in the ceramic body 110 due to a difference in shrinkage ratio when an active layer 115 and a lower cover layer 113 are subjected to sintering-shrinking.

Referring to FIG. 9, the multilayered ceramic capacitor according to the present embodiment may further include one or more dummy electrodes 124 in a length direction of the ceramic body 110 inside the lower cover layer 113 while the dummy electrodes 124 are laminated in a thickness direction of the ceramic body 110, regardless of capacitance formation.

When the dummy electrodes 124 are further formed inside the lower cover layer 113 as described above, asymmetry in step height of a margin part in an L direction of the ceramic body 110 is reduced, and thus the difference in a shrinkage ratio between the active layer 115 and the lower cover layer 113 is reduced, whereby the occurrence of delamination or cracks in the ceramic body 110 may be decreased or the effect of the delamination or cracks on the active layer 115 may be significantly reduced even in the case that delamination or cracks occurs, and acoustic noise may be reduced.

In order to increase the efficiency described above, the dummy electrodes 124 formed inside the lower cover layer 113 may be formed oppositely to the dummy electrodes 123 formed inside the upper cover layer 112, and may be adjacent to a lower end of the active layer 115.

Here, the structure defined as the active layer 115 of the ceramic body 110, the first and second internal electrodes 121 and 122, the upper cover layer 112 and the lower cover layer 113, and the first and second external electrodes 131 and 132 is similar to that in the above-described embodiment, and thus specific descriptions thereof will be omitted to avoid overlapping descriptions.

Figure 10:
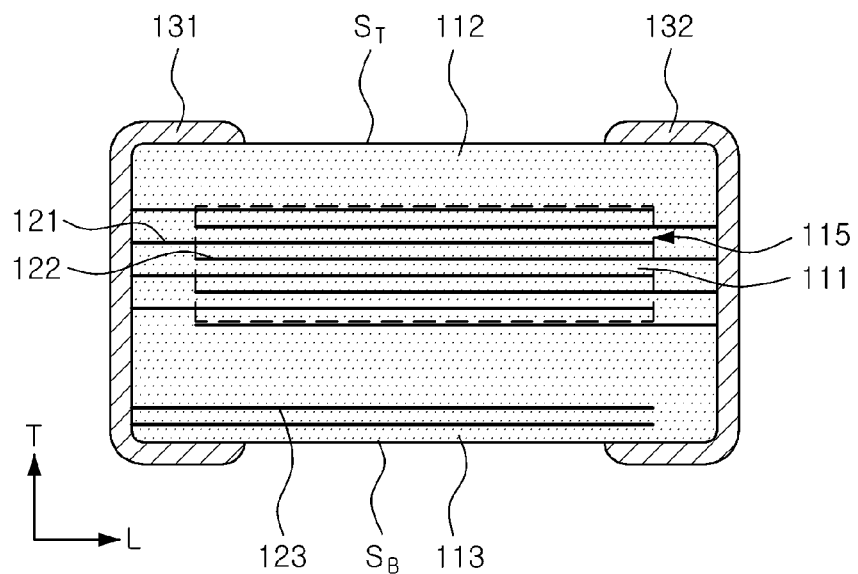

FIG. 10 is a schematic view showing a multilayered ceramic capacitor according to another embodiment of the present invention.

Like in the above-described embodiment, in the case in which the upper cover layer 112 is relatively too thick when the dummy electrode 123 is formed inside the upper cover layer 112, the dummy electrodes 123 need to be laminated as many as the thickness of the upper cover layer 112.

Referring to FIG. 10, in a multilayered ceramic capacitor of the present embodiment, a dummy electrode 123 is formed inside a lower cover layer 113 but not inside a thick upper cover layer 112.

This structure may be useful for a multilayered ceramic capacitor of which the upper cover layer is relatively too thick, and in this case, a surface of the multilayered ceramic capacitor through which the dummy electrode is not seen may be determined as a top surface when the multilayered ceramic capacitor is mounted on a printed circuit board, contrary to the above-described embodiment in which the foregoing multilayered ceramic capacitor is mounted on the printed circuit board.

In addition, the dummy electrode 123 disposed in the lowermost portion of the lower cover layer 113 may be formed as closely as possible to a bottom surface ($S_B$) of the ceramic body 110 inside the lower cover layer 113 such that the dummy electrode 123 is easily seen through a top surface ($S_T$) of the ceramic body 110.

The dummy electrode 123 may be formed by using an internal electrode having directionality the same as a second internal electrode 122 located in the lowermost portion of the active layer 115, and in this case, the dummy electrode 123 does not have a structure in which different polarities of internal electrodes overlap each other having a dielectric layer interposed therebetween.

Therefore, the dummy electrode 123 does not contribute to capacitance formation except for parasitic capacitance generated due to effects of the external electrodes 131 and 132 formed on both ends in the length direction of the ceramic body 110 or the active layer 115 for forming capacitance.

Here, the structure defined as the active layer 115 of the ceramic body 110, the first and second internal electrodes 121 and 122, the upper cover layer 112 and the lower cover layer 113, and the first and second external electrodes 131 and 132 is similar to that in the above-described embodiment, and thus specific descriptions thereof will be omitted to avoid overlapping descriptions.

Figure 11:
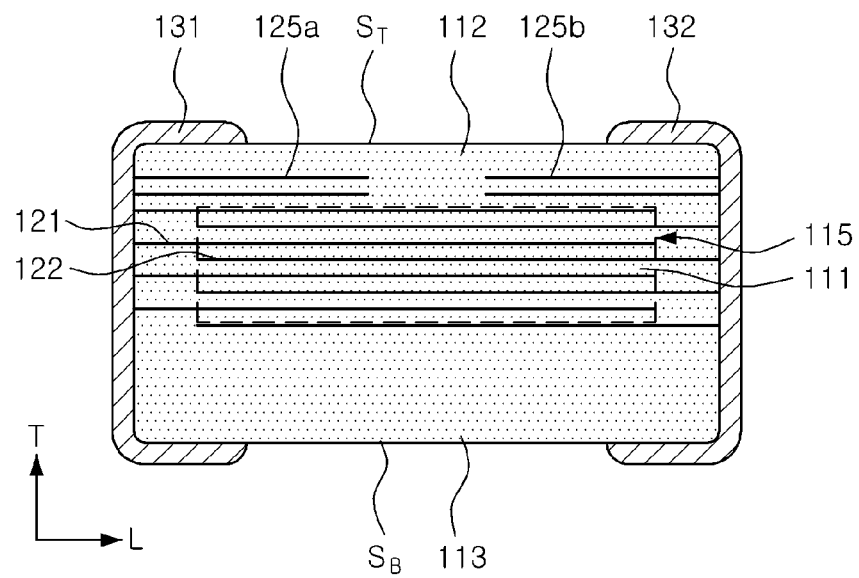

FIG. 11 is a schematic view showing a multilayered ceramic capacitor according to another embodiment of the present invention.

Referring to FIG. 11, a dummy electrode may include a first dummy electrode 125a exposed through one surface of an upper cover layer 112 and a second dummy electrode 125b exposed through the other surface of the upper cover layer 112, and the first and second dummy electrodes 125a and 125b may face each other on the same horizontal plane with an interval therebetween.

In the present embodiment, the first and second dummy electrodes 125a and 125b are shown to be laminated in two layers in a thickness direction inside the upper cover layer 112, but the present invention is not limited thereto. As necessary, the first and second dummy electrodes 125a and 125b may respectively be a single layer, or three or more layers of first and second dummy electrodes may be laminated in the thickness direction.

Here, the structure defined as the active layer 115 of the ceramic body 110, the first and second internal electrodes 121 and 122, the upper cover layer 112 and the lower cover layer 113, and the first and second external electrodes 131 and 132 is similar to that in the above-described embodiment, and thus specific descriptions thereof will be omitted to avoid overlapping descriptions.

Figure 12:
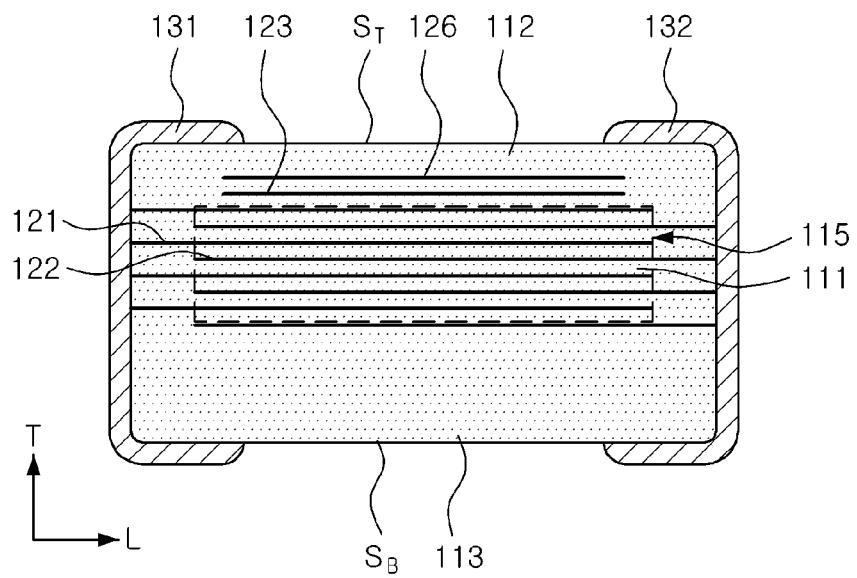
Figure 13:
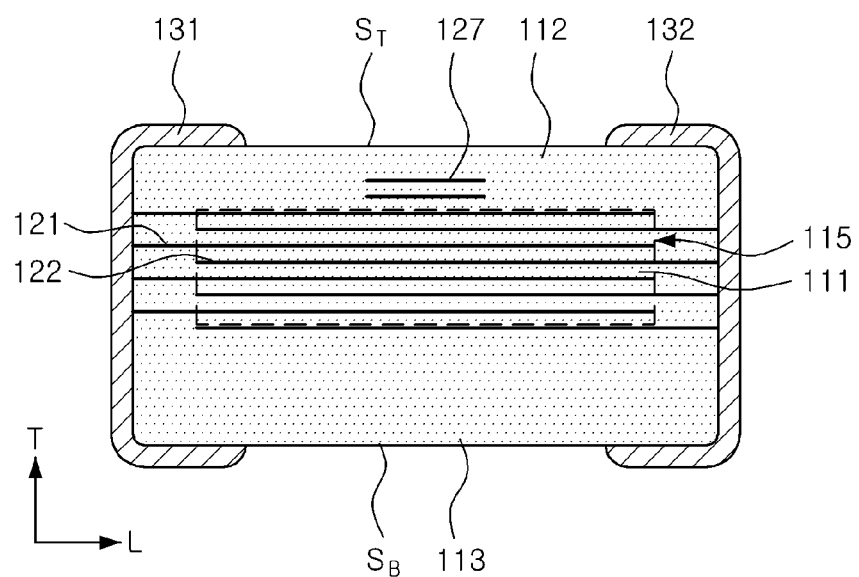

FIGS. 12 and 13 are schematic views showing multilayered ceramic capacitors according to another embodiment of the present invention.

In the present embodiments, upper and lower end portions of first and second external electrodes 131 and 132 may cover at least portions of top and bottom surfaces of a ceramic body 110 in order to improve reliability.

In addition, the dummy electrode may be spaced apart from both end surfaces of the upper cover layer 112, and here, the length of the dummy electrode is not particularly limited and may be variously changed.

For example, referring to FIG. 12, the length of the dummy electrode 126 is provided such that the dummy electrode 126 partially overlaps portions of the first and second external electrodes 131 and 132 covering the at least portions of the top and bottom surfaces of the ceramic body 110, in a thickness direction of the ceramic body 110.

In addition, referring to FIG. 13, the length of the dummy electrode 127 may be provided such that the dummy electrode 127 does not overlap portions of the first and second external electrodes 131 and 132 covering the at least portions of the top and bottom surfaces of the ceramic body 110, in a thickness direction of the ceramic body 110.

Here, the structure defined as the active layer 115 of the ceramic body 110, the first and second internal electrodes 121 and 122, the upper cover layer 112 and the lower cover layer 113, and the first and second external electrodes 131 and 132 is similar to that in the above-described embodiment, and thus specific descriptions thereof will be omitted to avoid overlapping descriptions.

As set forth above, according to the embodiments of the invention, vibrations generated from the multilayered ceramic capacitor may be decreased and thus acoustic noise may be reduced at the time of mounting the multilayered ceramic capacitor on the printed circuit board. Further, the upper and lower directions of the multilayered ceramic capacitor when the multilayered ceramic capacitor is mounted on a printed circuit board may be easily differentiated from each other and thus the multilayered ceramic capacitor may be prevented from being mounted upside down, thereby improving assembly efficiency of the mounting substrate and decreasing the amount of defective mounting substrates produced.

While the present invention has been shown and described in connection with the embodiments, it will be apparent to those skilled in the art that modifications and variations can be made without departing from the spirit and scope of the invention as defined as the appended claims.

What is claimed is:
1. A multilayered ceramic capacitor, comprising:
a ceramic body having a plurality of dielectric layers laminated therein;
an active layer including a plurality of first and second internal electrodes having individual dielectric layers interposed therebetween to form capacitance, the first and second internal electrodes being alternately exposed through respective end surfaces of the ceramic body;

an upper cover layer formed above the active layer;

a lower cover layer formed below the active layer, the lower cover layer being thicker than the upper cover layer;

a dummy electrode formed inside at least one of the upper cover layer and the lower cover layer so as to be seen through a top surface or a bottom surface of the ceramic body, regardless of capacitance formation; and first and second external electrodes covering both end surfaces of the ceramic body, wherein, when A is defined as ½ of an overall thickness of the ceramic body, B is defined as a thickness of the lower cover layer, C is defined as ½ of an overall thickness of the active layer, and D is defined as a thickness of the upper cover layer, a ratio of deviation between a center of the active layer and a center of the ceramic body, (B+C)/A, satisfies $1.063 \le (B+C)/A \le 1.745$.

2. The multilayered ceramic capacitor of claim 1, wherein a ratio of the thickness (D) of the upper cover layer to the thickness (B) of the lower cover layer, D/B, satisfies $0.021 \le D/B \le 0.422$.

3. The multilayered ceramic capacitor of claim 1, wherein a ratio of the thickness (B) of the lower cover layer to ½ (A) of the overall thickness of the ceramic body, B/A, satisfies $0.329 \le B/A \le 1.522$.

4. The multilayered ceramic capacitor of claim 1, wherein a ratio of ½ (C) of the overall thickness of the active layer to the thickness (B) of the lower cover layer, C/B, satisfies $0.146 \le C/B \le 2.458$.

5. The multilayered ceramic capacitor of claim 1, wherein an end portion of the upper cover layer in which the dummy electrode is not formed has a thickness of 4 μm to 30 μm.

6. The multilayered ceramic capacitor of claim 5, wherein the dummy electrode is formed adjacently to the top surface of the ceramic body.

7. The multilayered ceramic capacitor of claim 5, wherein the dummy electrode is formed by using an internal electrode having directionality the same as the internal electrode disposed in the uppermost portion of the active layer.

8. The multilayered ceramic capacitor of claim 1, wherein an end portion of the lower cover layer in which the dummy electrode is not formed has a thickness of 4 μm to 30 μm.

9. The multilayered ceramic capacitor of claim 8, wherein the dummy electrode is formed adjacently to the bottom surface of the ceramic body.

10. The multilayered ceramic capacitor of claim 8, wherein the dummy electrode is formed by using an internal electrode having directionality the same as the internal electrode disposed in the lowermost portion of the active layer.

11. The multilayered ceramic capacitor of claim 1, wherein the dummy electrode is formed inside both of the upper cover layer and the lower cover layer, and the dummy electrodes formed inside the upper cover layer and the lower cover layer have different shapes.

12. The multilayered ceramic capacitor of claim 1, wherein the dummy electrode includes a first dummy electrode exposed through one end surface of the upper or lower cover layer and a second dummy electrode exposed through the other end surface of the upper or lower cover layer, the first dummy electrode and the second dummy electrode being opposite to each other on the same horizontal plane with an interval therebetween.

13. The multilayered ceramic capacitor of claim 1, wherein the dummy electrode is spaced apart from both end surfaces of the upper or lower cover layer.

14. The multilayered ceramic capacitor of claim 13, wherein the dummy electrode has a length such that the dummy electrode partially overlaps portions of the first and second external electrodes covering at least portions of the top and bottom surfaces of the ceramic body, in a thickness direction thereof.

15. The multilayered ceramic capacitor of claim 13, wherein the dummy electrode has a length such that the dummy electrode does not overlap portions of the first and second external electrodes covering the at least portions of the top and bottom surfaces of the ceramic body, in the thickness direction thereof.

16. The multilayered ceramic capacitor of claim 1, further comprising a dummy electrode formed in a portion of the lower cover layer, close to a lower end of the active layer, regardless of capacitance formation.

17. The multilayered ceramic capacitor of claim 16, wherein the dummy electrode formed in the portion of the lower cover layer, close to the lower end of the active layer, is formed by using an internal electrode opposite to the dummy electrode formed inside the upper cover layer.

18. The multilayered ceramic capacitor of claim 1, wherein points of inflection formed on respective end surfaces of the ceramic body are formed to have a height corresponding to or lower than a center of the ceramic body in the thickness direction, due to a difference between a deformation rate occurring in the center of the active layer and a deformation rate occurring in the lower cover layer, during the application of voltage thereto.

19. A mounting structure of a circuit board having a multilayered ceramic capacitor mounted thereon, the mounting structure comprising:

a printed circuit board having first and second electrode pads formed thereon; and a multilayered ceramic capacitor mounted on the printed circuit board, the multilayered ceramic capacitor including: a ceramic body having a plurality of dielectric layers laminated therein; an active layer including a plurality of first and second internal electrodes having individual dielectric layers interposed therebetween to form capacitance, the first and second internal electrodes being alternately exposed through respective end surfaces of the ceramic body; an upper cover layer formed above the active layer; a lower cover layer formed below the active layer, the lower cover layer being thicker than the upper cover layer; a dummy electrode formed inside at least one of the upper cover layer and the lower cover layer so as to be seen through a top surface or a bottom surface of the ceramic body, regardless of capacitance formation; and first and second external electrodes formed on both end surfaces of the ceramic body and soldering-connected to first and second electrode pads, wherein, when A is defined as ½ of an overall thickness of the ceramic body, B is defined as a thickness of the lower cover layer, C is defined as ½ of an overall thickness of the active layer, and D is defined as a thickness of the upper cover layer, a ratio of deviation between a center of the active layer and a center of the ceramic body, (B+C)/A, satisfies $1.063 \le (B+C)/A \le 1.745$.

20. The mounting structure of claim 19, wherein points of inflection formed on respective end surfaces of the ceramic body are formed to have a height corresponding to or lower than soldering, due to a difference between a deformation rate occurring in the center of the active layer and a deformation rate occurring in the lower cover layer, during the application of voltage thereto.

21. A packing unit for a multilayered ceramic capacitor, the packing unit comprising:
one or more multilayered ceramic capacitors, the one or more multilayered ceramic capacitors including: a ceramic body having a plurality of dielectric layers laminated therein; an active layer including a plurality of first and second internal electrodes having individual dielectric layers interposed therebetween, the first and second internal electrodes being alternately exposed through respective end surfaces of the ceramic body; an upper cover layer formed above the active layer; a lower cover layer formed below the active layer, the lower cover layer being thicker than the upper cover layer; a dummy electrode formed inside at least one of the upper cover layer and the lower cover layer so as to be seen through a top surface or a bottom surface of the ceramic body, regardless of capacitance formation; and first and second external electrodes formed on both end surfaces of the ceramic body and electrically connected to exposed portions of the first and second internal electrodes, wherein when A is defined as ½ of an overall thickness of the ceramic body, B is defined as a thickness of the lower cover layer, C is defined as ½ of an overall thickness of the active layer, and D is defined as a thickness of the upper cover layer, a ratio of deviation between a center of the active layer and a center of the ceramic body, $(B+C)/A$, satisfies $1.063 \leq (B+C)/A \leq 1.745$; and
a packing sheet having a plurality of receiving parts in which the multilayered ceramic capacitors are respectively received, the lower cover layer of the multilayered ceramic capacitor facing a bottom surface of the receiving part.

22. The packing unit of claim 21, further comprising a packing film attached to one surface of the packing sheet so as to seal the receiving parts in which the multilayered ceramic capacitors are respectively received.

23. The packing unit of claim 21, wherein the packing sheet is wound as a reel.

* * * * *